US012757468B2

(12) United States Patent
Zierak et al.

(10) Patent No.: US 12,757,468 B2
(45) Date of Patent: Oct. 6, 2026

(54) HEMT DEVICE WITH FIELD PLATES

(71) Applicant: GlobalFoundries U.S. Inc., Malta, NY (US)

(72) Inventors: Michael J. Zierak, Colchester, VT (US); Steven J. Bentley, Menands, NY (US); Santosh Sharma, Austin, TX (US); Mark D. Levy, Williston, VT (US); Johnatan A. Kantarovsky, South Burlington, VT (US)

(73) Assignee: GLOBALFOUNDRIES U.S. Inc, Malta, NY (US)

( * ) Notice: Subject to any disclaimer, the term of this patent is extended or adjusted under 35 U.S.C. 154(b) by 619 days.

(21) Appl. No.: 17/964,356

(22) Filed: Oct. 12, 2022

(65) Prior Publication Data

US 2024/0128328 A1 Apr. 18, 2024
US 2026/0190413 A2 Jul. 2, 2026

(51) Int. Cl.

*H10D 64/00* (2025.01)
*H10D 30/47* (2025.01)
*H10D 62/85* (2025.01)
*H10D 64/01* (2025.01)

(52) U.S. Cl.

CPC ......... *H10D 64/111* (2025.01); *H10D 30/475* (2025.01); *H10D 62/8503* (2025.01); *H10D 64/021* (2025.01)

(58) Field of Classification Search

CPC ............. H10D 64/111; H10D 62/8503; H10D 64/021; H10D 30/475

See application file for complete search history.

(56) References Cited

U.S. PATENT DOCUMENTS

| | | | |
|---|---|---|---|
| 7,550,783 B2 | 6/2009 | Wu et al. | |
| 7,851,825 B2 | 12/2010 | Suh et al. | |
| 8,168,486 B2 | 5/2012 | Hebert | |
| 8,283,699 B2 | 10/2012 | Wu | |
| 8,404,508 B2 | 3/2013 | Lidow et al. | |
| 8,754,496 B2 | 6/2014 | Tserng et al. | |
| 8,933,486 B2 | 1/2015 | Wu | |
| 9,590,069 B2 | 3/2017 | Dasgupta et al. | |
| 2006/0255377 A1 | 11/2006 | Tu | |

(Continued)

FOREIGN PATENT DOCUMENTS

| | | | |
|---|---|---|---|
| CN | 103745993 A * | 4/2014 | ......... H01L 29/0634 |
| CN | 106486543 B * | 12/2019 | ........... H01L 29/402 |

(Continued)

OTHER PUBLICATIONS

The Extended European Search Report and Opinion dated Jul. 22, 2024 in EP Application No. 23206288.5/ 4383244, 11 pages.

(Continued)

*Primary Examiner* — Ratisha Mehta
*Assistant Examiner* — Timothy Edward Duren
(74) *Attorney, Agent, or Firm* — Francois Pagette; Andrew M. Calderon; Calderon Safran & Wright P.C.

(57) ABSTRACT

The present disclosure relates to a structure which includes at least one gate structure over semiconductor material, the at least one gate structure comprising an active layer, a gate metal extending from the active layer and a sidewall spacer on sidewalls of the gate metal, and a field plate aligned with the at least one gate structure and isolated from the gate metal by the sidewall spacer.

19 Claims, 9 Drawing Sheets

(56) References Cited

U.S. PATENT DOCUMENTS

| | | | | |
|---|---|---|---|---|
| 2008/0308813 | A1 | 12/2008 | Suh et al. | |
| 2012/0261720 | A1* | 10/2012 | Puglisi | H10D 30/015 257/E21.403 |
| 2013/0320349 | A1 | 12/2013 | Saunier et al. | |
| 2014/0097471 | A1 | 4/2014 | Briere | |
| 2014/0264431 | A1 | 9/2014 | Lal | |
| 2020/0227545 | A1 | 7/2020 | Then et al. | |
| 2020/0357736 | A1 | 11/2020 | Akutsu et al. | |
| 2020/0381518 | A1 | 12/2020 | Otake | |
| 2021/0111254 | A1 | 4/2021 | Jones et al. | |
| 2022/0223699 | A1 | 7/2022 | Brun et al. | |
| 2022/0238694 | A1 | 7/2022 | Yang et al. | |
| 2022/0254912 | A1 | 8/2022 | Ramdani | |
| 2022/0262940 | A1* | 8/2022 | Coppens | H10D 30/4755 |
| 2022/0293779 | A1 | 9/2022 | Du | |
| 2023/0124962 | A1 | 4/2023 | Jain et al. | |
| 2024/0105450 | A1 | 3/2024 | Saripalli | |
| 2024/0304678 | A1 | 9/2024 | Sang Lee | |
| 2024/0304702 | A1 | 9/2024 | Bothe | |
| 2024/0429120 | A1 | 12/2024 | Schuette | |
| 2025/0048668 | A1 | 2/2025 | Meng | |
| 2025/0331297 | A1 | 10/2025 | Kudymov | |

FOREIGN PATENT DOCUMENTS

| | | | | | |
|---|---|---|---|---|---|
| CN | 111129138 | | | 5/2020 | |
| CN | 112490279 | A | * | 3/2021 | H01L 21/28264 |
| EP | 4033541 | | | 7/2022 | |
| KR | 10-2022-0100481 | A | | 7/2022 | |
| TW | 200947703 | A | | 11/2009 | |
| TW | 202127669 | A | | 7/2021 | |
| WO | 2021/076367 | | | 4/2021 | |

OTHER PUBLICATIONS

The Extended European Search Report and Opinion dated Jul. 19, 2024 in EP Application No. 24164396.4-1211, 10 pages.

Foreign Office Action in TW Application No. 114103992 dated Mar. 21, 2025; 4 pages.

Notice of Preliminary Rejection dated Dec. 16, 2024 in KR Application No. 10-2023-0155084, 18 pages.

European Search Report and Opinion dated Jul. 10, 2024 in EP Application No. 23195277.1-1211/4354511, 10 pages.

Specification and Drawings in the related U.S. Appl. No. 18/226,982, filed Jul. 27, 2023, 24 pages.

Notice of Preliminary Rejection dated May 9, 2025 in KR Application No. 10-2024-0121262, 14 pages.

EPO Office Action dated Oct. 10, 2025 in EP Application No. 24 164 396.4-1211, 8 pages.

Final Office Action in U.S. Appl. No. 18/078,425 dated Jan. 27, 2026; 15 pages.

Foreign Office Action in TW Application No. 113133506 dated Feb. 4, 2026; 18 pages.

Search Report TW Application No. 113133506 dated Feb. 2, 2026, 4 pages.

Korean Application No. 10-2026-0004041, Notice of Preliminary Rejection dated Jun. 1, 2026, 20 pages.

Non-Final Office Action in U.S. Appl. No. 18/376,668 dated Mar. 19, 2026; 16 pages.

Non-Final Office Action in U.S. Appl. No. 18/385,255 dated May 18, 2026; 14 pages.

* cited by examiner

HEMT DEVICE WITH FIELD PLATES

BACKGROUND

The present disclosure relates to semiconductor structures and, more particularly, to a device with field plates aligned to a gate contact and methods of manufacture and operation.

High voltage gallium nitride (GaN) devices include very large electric fields that can cause performance and reliability issues. In order to alleviate performance and reliability issues, source-connected field plates can be used; however, source-connected field plates can be limited in their device layouts.

SUMMARY

In an aspect of the disclosure, a structure comprises: at least one gate structure over semiconductor material, the at least one gate structure comprising an active layer, a gate metal extending from the active layer and a sidewall spacer on sidewalls of the gate metal; and a field plate aligned with the at least one gate structure and isolated from the gate metal by the sidewall spacer.

In an aspect of the disclosure, a structure comprises: at least one gate structure; and a field plate which vertically overlaps with a portion of the at least one gate structure.

In an aspect of the disclosure, a method comprises: forming at least one gate structure over semiconductor material, the at least one gate structure comprising an active layer, a gate metal extending from the active layer and a sidewall spacer on sidewalls of the gate metal; and forming a field plate aligned with the at least one gate structure and isolated from the gate metal by the sidewall spacer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a device with field plates aligned to a gate contact and methods of manufacture and operation.

In more specific embodiments, a metal field plate may be self-aligned to a gate contact of a device and separated therefrom by a dielectric spacer. In this way, a lateral field plate may be immediately adjacent to the gate contact and the dielectric spacer. Further, the field plate may be above a top surface of the gate contact and below gate metals. Advantageously, the field plate is self-aligned and has an improved control of the electric field for enhanced performance and reliability and improved device scaling for an overall reduction in Ron, in various layouts in comparison to known circuits.

In more specific embodiments, an enhancement mode device may comprise a GaN device structure with self-aligned field plates. In embodiments, the structure may also include a depletion mode gate on an active layer over a semiconductor material, and at least two gate islands, e.g., pGaN gate structures, which surround sides of the depletion mode gate. The two islands would utilize a single field plate between them.

The device of the present disclosure may be manufactured in several ways using a number of different tools. In general, though, the methodologies and tools are used to form structures with dimensions in the micrometer and nanometer scale. The methodologies, i.e., technologies, employed to manufacture the device of the present disclosure have been adopted from integrated circuit (IC) technology. For example, the structures are built on wafers and are realized in films of material patterned by photolithographic processes on the top of a wafer. In particular, the fabrication of the device uses three basic building blocks: (i) deposition of thin films of material on a substrate, (ii) applying a patterned mask on top of the films by photolithographic imaging, and (iii) etching the films selectively to the mask.

Figure 1:
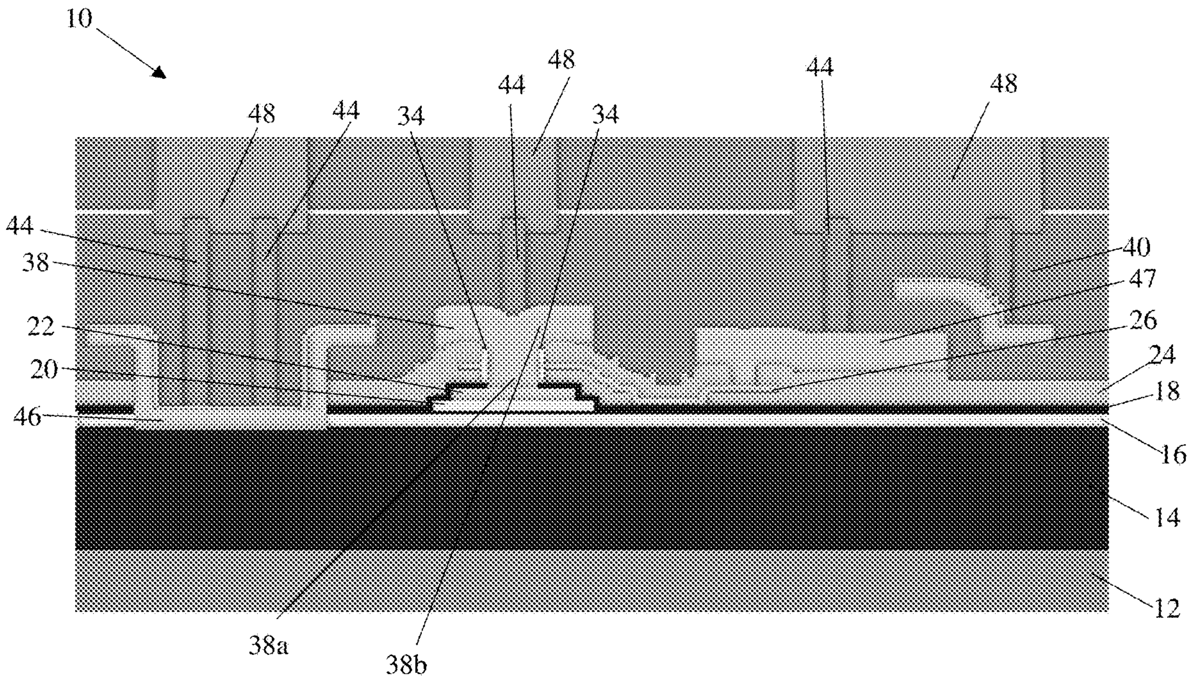
FIG. 1 shows a device with a field plate, amongst other features, in accordance with additional aspects of the present disclosure.

FIG. 1 shows a device with self-aligned field plates, amongst other features, in accordance with aspects of the present disclosure. In FIG. 1, the device 10 includes a semiconductor substrate 12. The semiconductor substrate 12 may be composed of any suitable semiconductor material including, but not limited to, Si, SiGe, SiGeC, SiC, Qromis substrate technology (QST), semiconductor-on-insulator (SOI), GaAs, GaN, InAs, InP, and other III/V or II/VI compound semiconductors. A buffer layer 14 may be on the semiconductor substrate 12. In embodiments, the buffer layer 14 may be composed of GaN or AlGaN. An active device layer 16 may be on the buffer layer 14, which may be composed of at least GaN and/or AlGaN. A passivation layer 18 may be on the active layer 16. In embodiments, the passivation layer 18 may be composed of $Al_2O_3$ and/or SiN, as examples.

Still referring to FIG. 1, a gate structure 20 comprised of GaN material and, more preferably, a p-doped GaN material may be formed, e.g., deposited and patterned, on the active layer 16. In embodiments, a metal material 22, e.g., TiN, may be formed on the gate structure 20. The passivation layer 18 may be provided over the gate structure 20 and the metal material 22. The gate structure 20 and metal material 22 may be deposited by a conventional deposition method (e.g., chemical vapor deposition (CVD)), followed by conventional lithography and etching processes. A gate metal 38 may be formed in contact with the metal material 22. A sidewall spacer 34 surrounds the gate metal 38, e.g., formed on sidewalls of the gate metal 38. The sidewall spacer 34 may be composed of SiN for improved etch and corner protections.

A field plate 26 may be in contact with the sidewall spacer 34 and surrounding the gate metal 38. In embodiments, the field plate 26 may surround a narrow stem portion 38*a* of the gate metal 38, with a wider overhang portion 38*b* being over the field plate 26. The field plate 26 may be composed of TiN, although other materials are also contemplated by the present disclosure. In embodiments, the field plate 26 may be embedded within dielectric material 24, e.g., $SiO_2$. The field plate 26 may also include stepped features, with a portion of the field plate 26 contacting the underlying passivation layer 18. In particular, the field plate 26 may include a step shape which contacts the passivation layer 18 and extending partially over the active layer 16. In further embodiments, the field plate 26 may include a sloped shape, a flat shape, etc.

In more specific embodiments, the field plate 26 is self-aligned (i.e., horizontally aligned) with the gate metal 38 by completely surrounding a vertical portion, e.g., stem portion 38*a* of the gate metal 38 (i.e., the field plate 26 is on both sides of the gate metal 38). In particular, the field plate 26 may vertically overlap with a portion of the gate structure 20, including the GaN material. The field plate 26 may be separated, e.g., electrically isolated, from the vertical portion of the gate metal 38 by the sidewall spacer 34. The field plate 26 may be connected to a source through metal contacts out of the plane of FIG. 1. In embodiments, the field plate 26 may also be connected to the gate structure 20 or any other circuit. In this layout, the self-aligned field plate 26 provides improved control of the electric field for enhanced performance and reliability while retaining device layout flexibility. Also, as the field plate 26 may be connected to the source, the electric field control is improved which improves channel functionality and allows for a zero voltage bias.

FIG. 1 further shows an ohmic metal 46 in contact with the underlying active layer 16 and a gate metal 47 in contact with the field plate 26. The ohmic metal 46 and gate metal 47 may be formed using conventional lithography, etching, and deposition processes as is known in the art. Back end of the line (BEOL) contacts 44 (e.g., vias) may be formed in contact with the ohmic metal 46 and gate metals 38, 47. Wiring lines 48 may be formed in contact to the contacts 44.

The contacts 44 (e.g., vias) and wiring lines 48 may be formed in an interlevel dielectric material (ILD) 40, e.g., layers of oxide and nitride, which is deposited over the gate metal 38 by conventional deposition processes. The contacts 44 (e.g., vias) and wiring lines 48 may be formed by conventional lithography and etching processes to form trenches in the interlevel dielectric material (ILD) 40, followed by a deposition process of metal material and a planarization process, e.g., chemical mechanical planarization, to remove any excessive metal from the interlevel dielectric material (ILD) 40. It should be understood by those of skill in the art that the interlevel dielectric material (ILD) 40 may be several different layers of materials and the contacts 44 (e.g., vias) and wiring lines 48 may be formed by one or more single or dual damascene processes.

Figure 2:
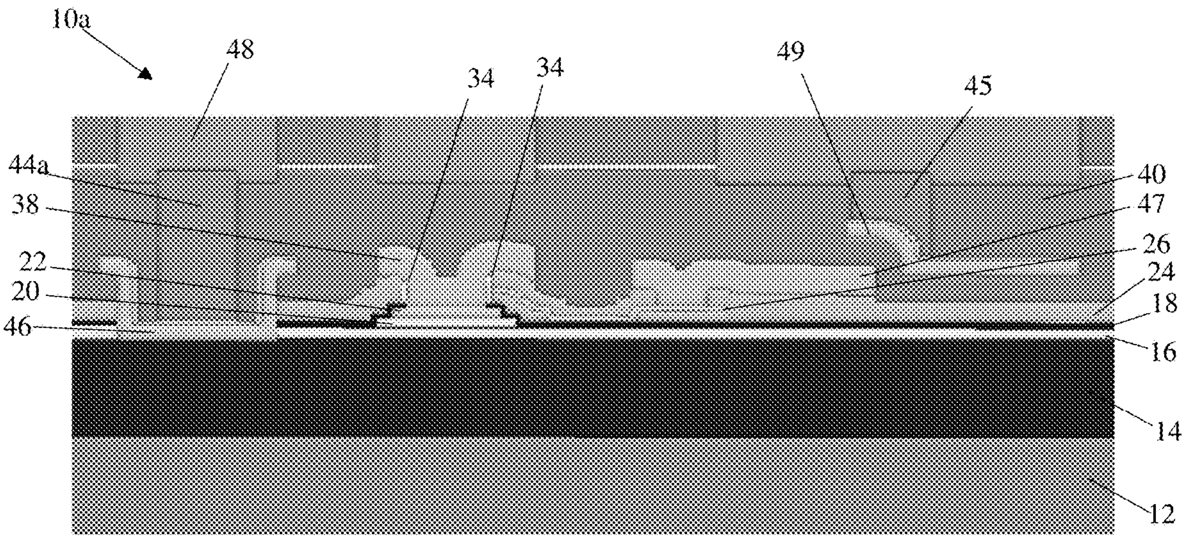
FIG. 2 shows a device with a field plate, amongst other features, in accordance with additional aspects of the present disclosure.

FIG. 2 shows another structure 10*a* with the self-aligned field plate in accordance with aspects of the present disclosure. In FIG. 2, the field plate 26 is provided on a single side of the gate metal 38. Therefore, the field plate 26 of FIG. 2 does not completely surround both sides of the gate metal 38 (i.e., the field plate 26 is only on one side of a vertical portion of the gate metal 38). In addition, a single contact 44*a* may be used to connect to the ohmic metal 46. Also, a contact 45 may be provided to the ohmic metal 49 (e.g., field plate).

Figure 3:
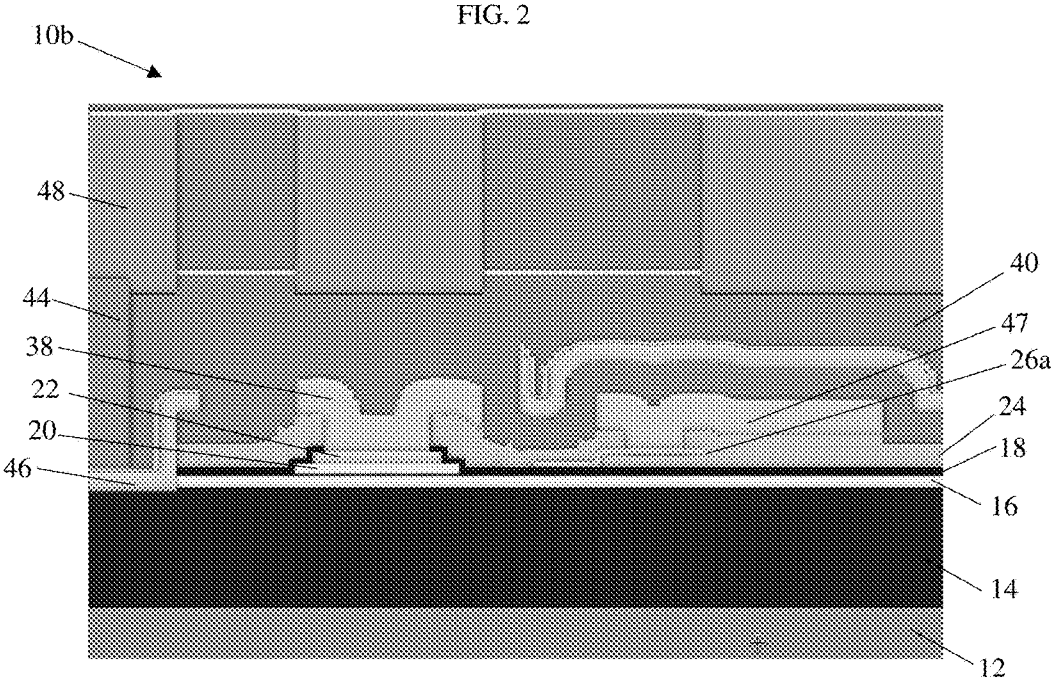
FIG. 3 shows a device with a field plate, amongst other features, in accordance with additional aspects of the present disclosure.

FIG. 3 shows a structure 10*b* with a non-self-aligned field plate 26*a*. In the structure 10*b*, the field plate 26*a* does not surround the gate metal 38. Instead, in FIG. 3, the field plate 26 is on a side of the gate metal 38 and the gate structure 20. This structure 10*b* can also be used with a device comprising a self-aligned plate on a same wafer.

Figure 4:
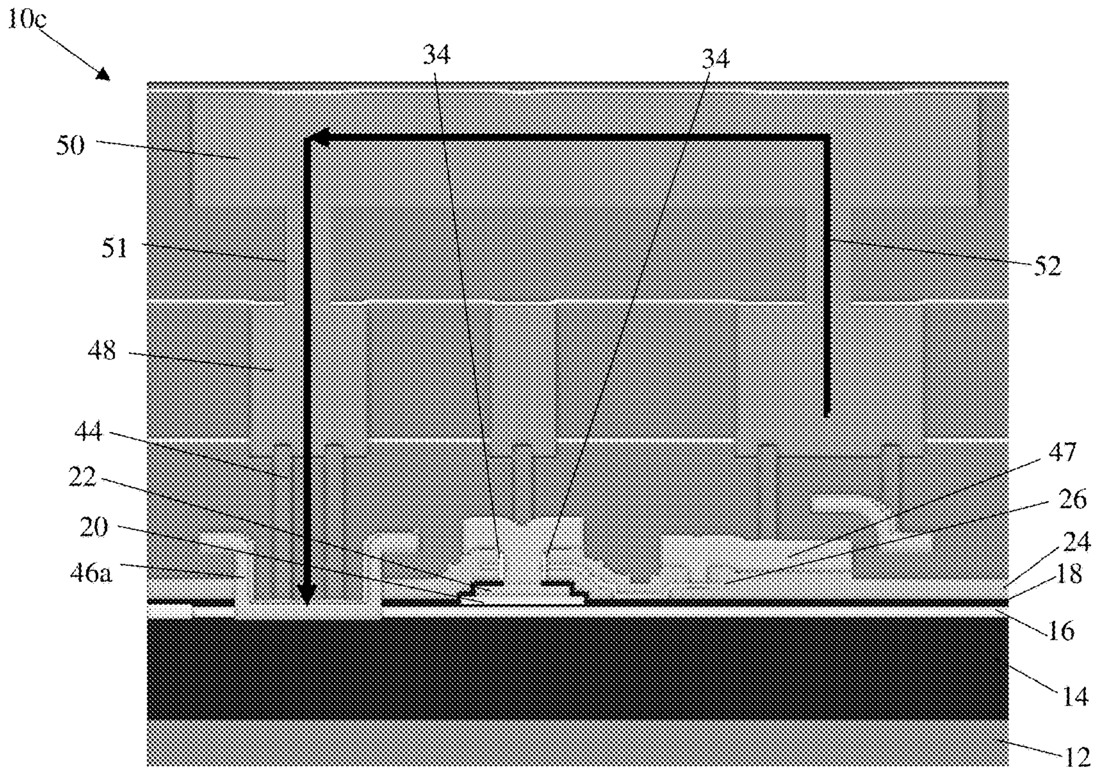
FIG. 4 shows a device with field plates, amongst other features, in accordance with additional aspects of the present disclosure.

FIG. 4 shows a structure 10*c* with the self-aligned field plate 26 connected to a source through BEOL wiring structures 48, 50. In embodiments, the BEOL wiring structures 50 are at a higher wiring level, M2, than the BEOL wiring structures 48 on wiring level M1. M1 and M2 wiring levels may be connected by a via contact 51. In FIG. 4, the ohmic metal 46*a* (on the left side of the gate metal 38) may be a source which is connected to the field plate 26 through the BEOL wiring structures 48, 50 as indicated by the arrow 52. In embodiments, the field plate 26 may be connected to a source which is out of the plane of the structure 10*c*.

Figure 5:
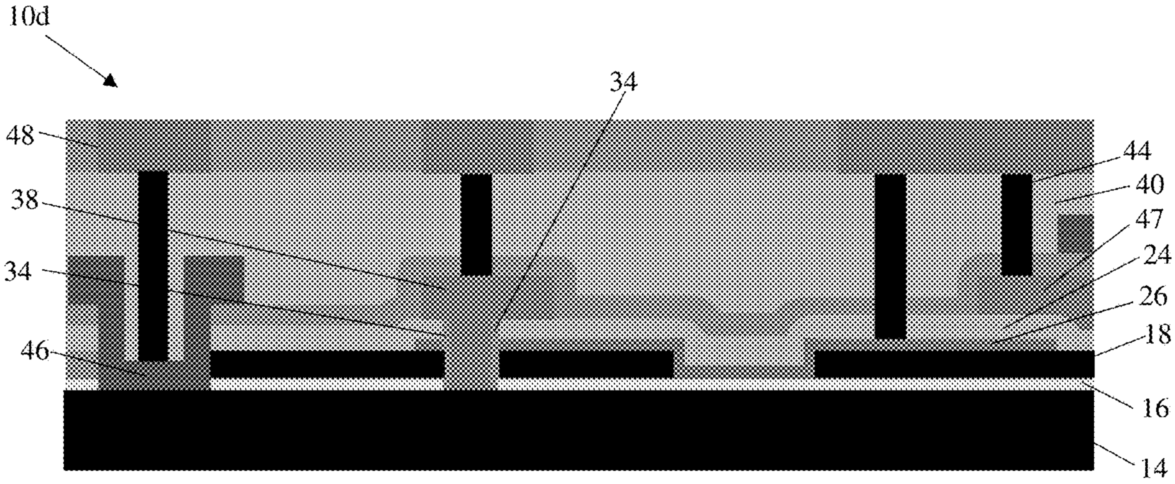
FIG. 5 shows a device with field plates in accordance with additional aspects of the present disclosure.

FIG. 5 shows a structure 10*d* with the self-aligned device in a high-electron-mobility transistor (HEMT). In the structure 10*d* of FIG. 5, the field plate 26 may surround a vertical portion of the gate metal 38 (i.e., the field plate is on both sides of the gate metal 38) and may be within the dielectric layer 24. Further, the field plate 26 may be separated from the vertical portion of the gate metal 38 by the sidewall spacer 34. Therefore, the structure 10*d* can operate at high frequencies with an improved control of the electric field for enhanced performance and reliability and improved device scaling. In further embodiments, the structure 10*d* may also be a metal-insulator-semiconductor high-electron-mobility transistor (MISHEMT).

Figure 6:
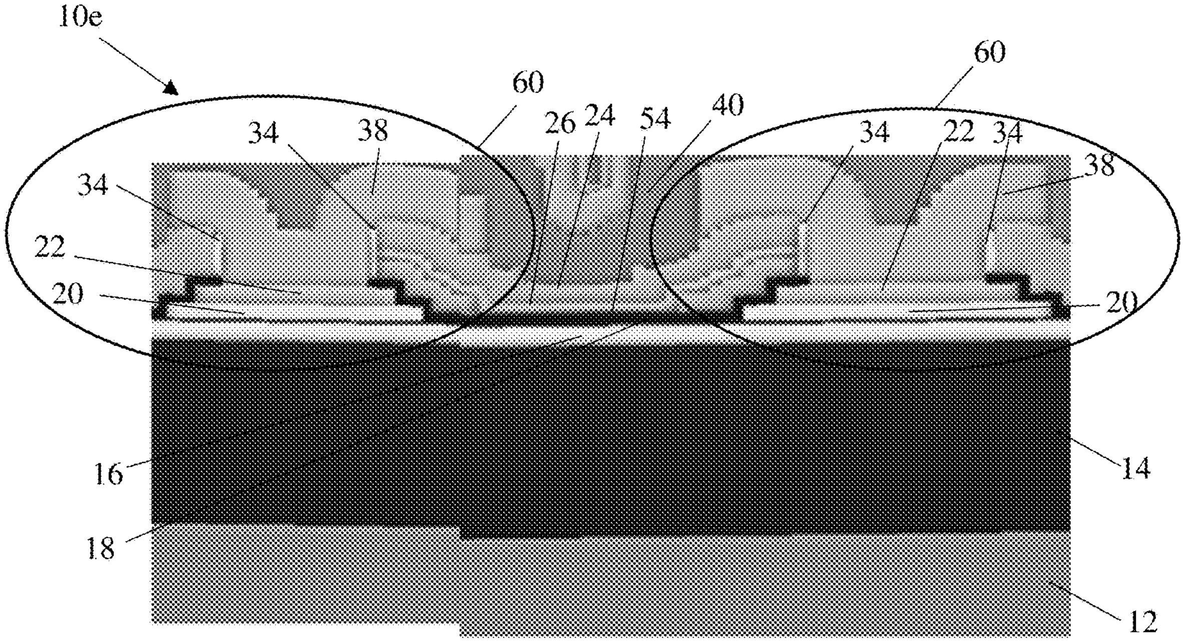
FIG. 6 shows a depletion mode of the device in accordance with aspects of the present disclosure.
Figure 7:
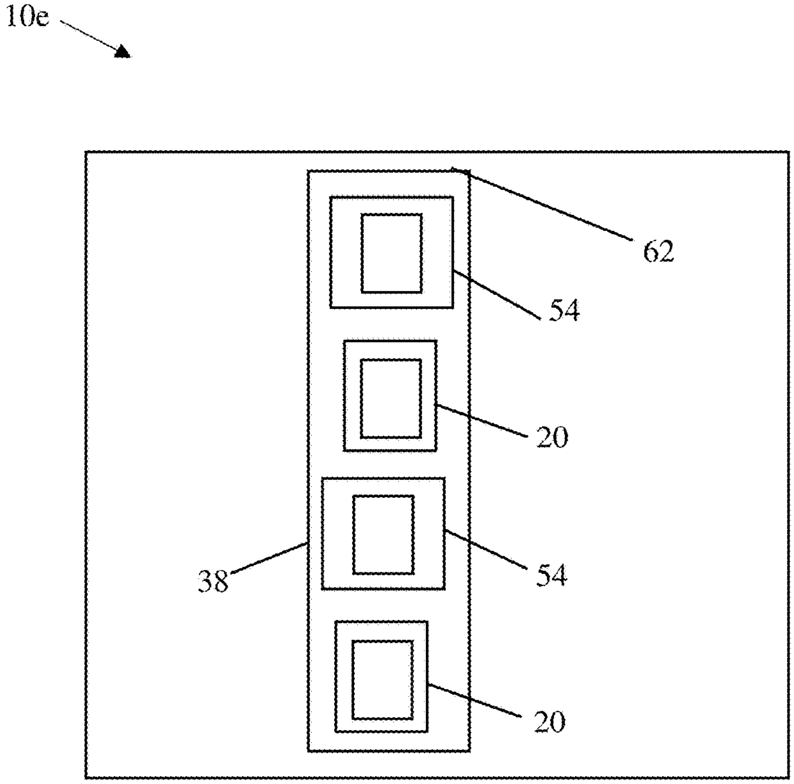
FIG. 7 shows a top-view layout of the structure of the device of FIG. 6.

FIG. 6 shows a structure 10*e* with a self-aligned field plate for two gate structures in accordance with aspects of the present disclosure. FIG. 7 shows a top view layout of the structure 10*e* of FIG. 6. More specifically, the structure 10*e* shows two gate islands 60 (e.g., two pGaN islands 60), each of which comprise the gate structure 20, the metal material 22, the sidewall spacer 34, and the gate metal 38. As shown in FIG. 6, the field plate 26 extends between the two gate islands 60 to the sidewall spacer 34 of each device.

Moreover, in FIGS. 6 and 7, a gate metal of a depletion mode device 54 is provided along a gate width dimension between the gate islands 20. Further, each of the two gate islands 60 act to deplete the 2DEG (e.g., 2 dimensional electron gas) concentration between the depletion mode devices 54 to create a tighter pinch off voltage (e.g., modulated pinch off voltage). In particular, by using the self-aligned approach in the structure 10*e*, each of the two gate islands 60 may be placed closer to the depletion mode device 54 (on a single finger 62 of a multi-finger device), which results in a better control of the pinch off voltage than a non self-aligned approach.

FIGS. 8A-8F show fabrication processes of the device in accordance with aspects of the present disclosure. In embodiments, similar fabrication processes may be used in manufacturing the devices shown in FIGS. 1-7.

Figure 8A:
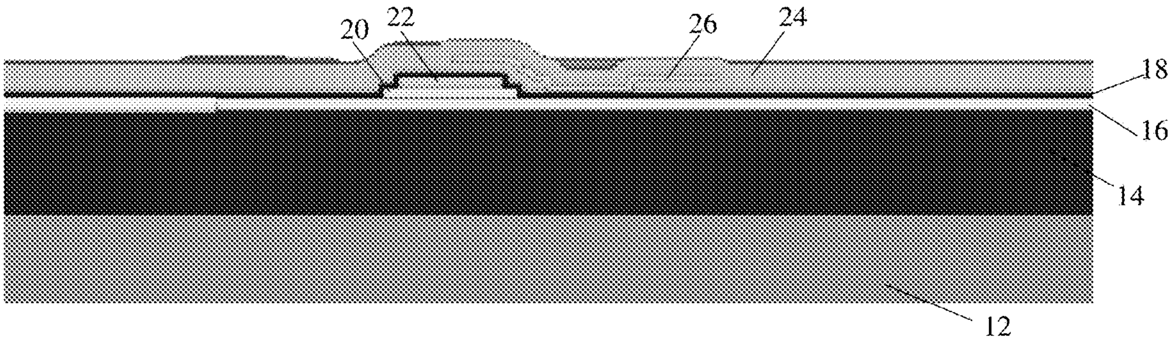
FIGS. 8A-8F show fabrication processes of manufacturing the devices with self-aligned plates in accordance with aspects of the present disclosure.

In FIG. 8A, the buffer layer 14 may be formed on the semiconductor substrate 12. The buffer layer 14 may be deposited on the semiconductor substrate 12 using any conventional deposition method, e.g., CVD or epitaxial growth processes. The active layer 16 may be formed on the buffer layer 14 and the passivation layer 18 may be formed on the active layer 16 using conventional deposition methods, e.g., CVD. Further, the gate structure 20 may be formed on the active layer 16 by epitaxially growing semiconductor material, e.g., GaN, on the active layer 16. In embodiments, an in-situ doping (e.g., p-type dopant) may be used during the epitaxial growth process. Further, the metal material 22 may be formed on the material of the gate structure 20. The metal material 22 and the gate structure 20 are patterned using conventional lithography and etching processes.

In FIG. 8A, dielectric material 24 may be deposited prior to the formation of the field plate 26. The field plate 26 may be blanket deposited over the gate structure 20 and dielectric material 24 using conventional deposition methods, e.g., CVD. A conventional patterning process may be used to pattern the field plate 26 on the dielectric layer 24. After the field plate 26 is patterned, the additional dielectric material may be deposited on the field plate 26.

Figure 8B:
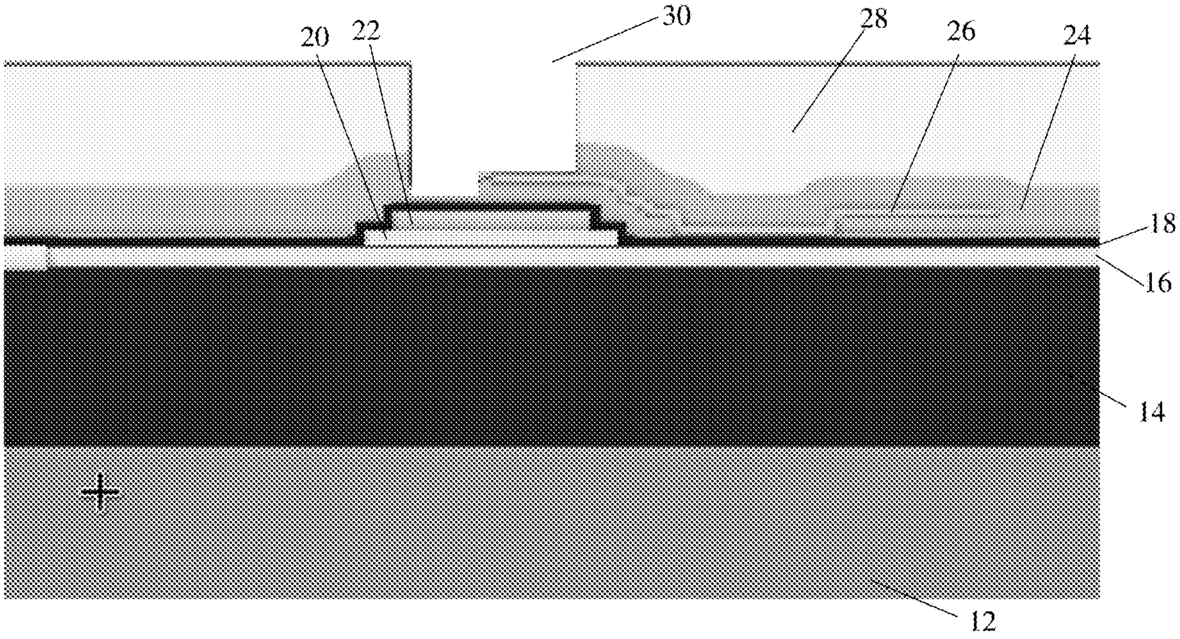

In FIG. 8B, a dielectric material 28, e.g., $SiO_2$, may be deposited over the dielectric layer 24 by conventional deposition methods, e.g., CVD. An opening 30 may be formed in the dielectric materials 24, 28. The opening 30 punches through the field plate 26, the passivation material 18 and exposes the gate metal 22. By way of example, a resist formed over the dielectric material 28 may be exposed to energy (light) to form a pattern (i.e., opening). An etching process with a selective chemistry, e.g., RIE, will be used to transfer to the pattern from the photoresist layer to form the opening 30.

Figure 8C:
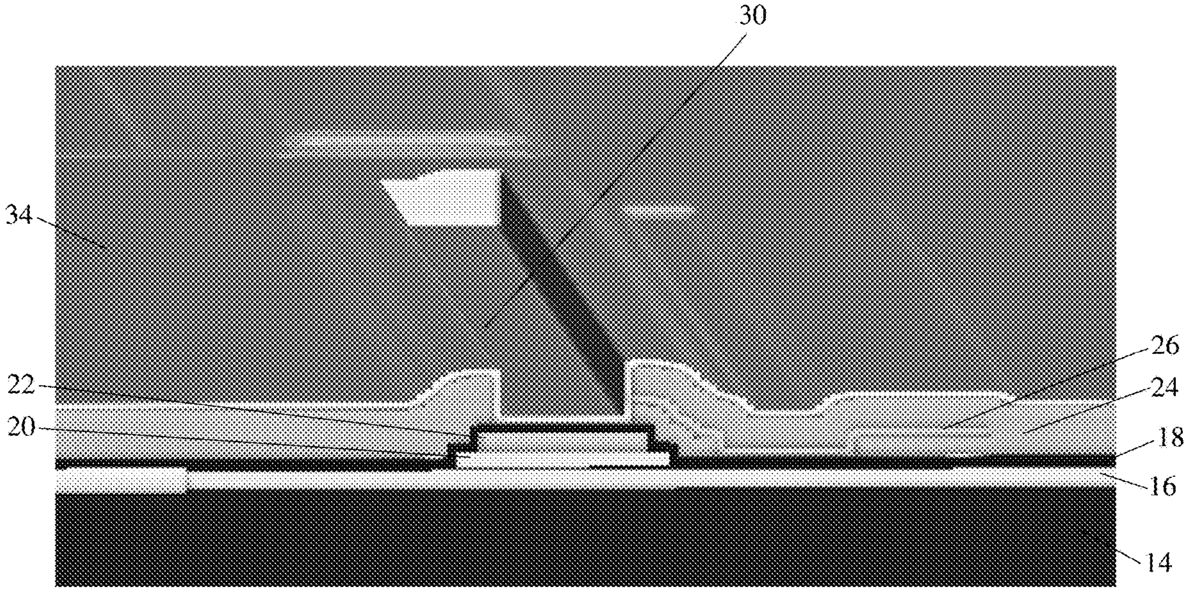

In FIG. 8C, the material for the sidewall spacer 34 may be deposited on the dielectric layer 24 and within the opening 30 using conventional deposition methods, e.g., CVD. In embodiments, the sidewall spacer material 34 may be SiN material.

Figure 8D:
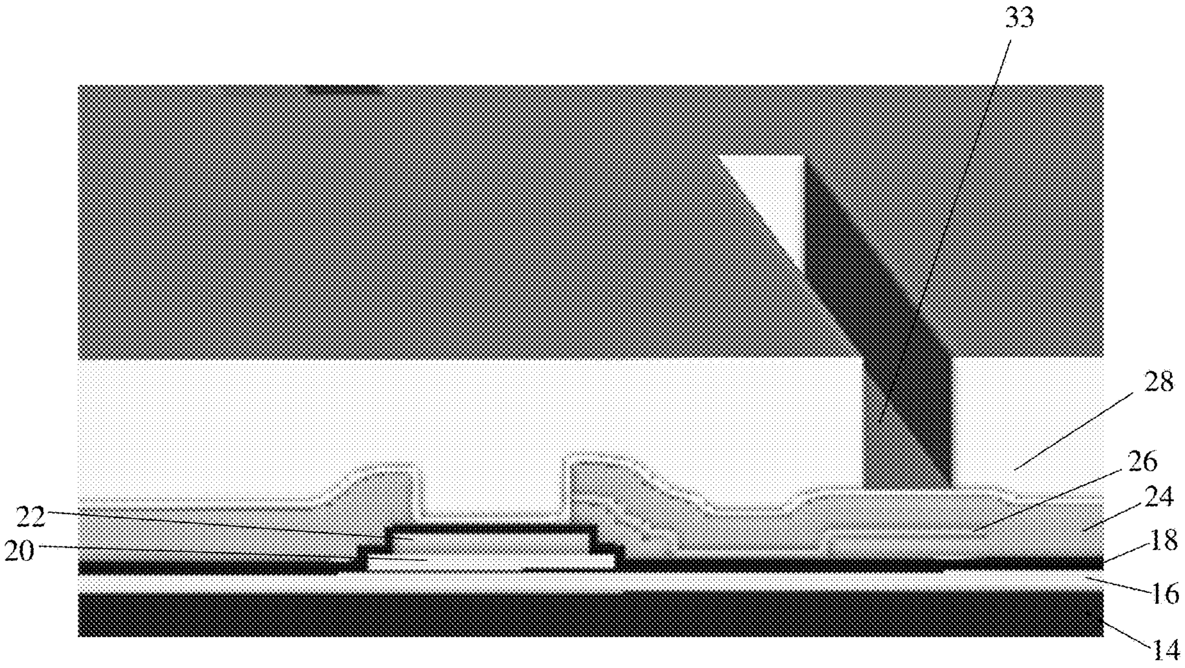

In FIG. 8D, an opening 33 may be formed over another portion of the field plate 26 at a region of a non-self-aligned field plate. In this layout, the field plate 26 below the trench 33 is unaffected (i.e., not removed).

Figure 8E:
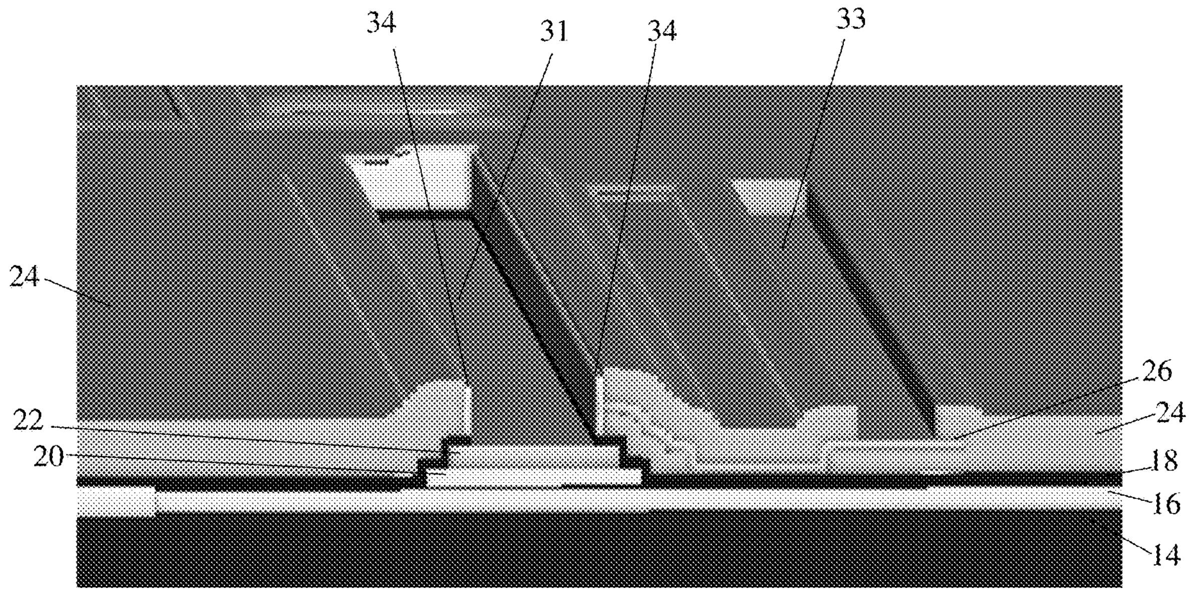

In FIG. 8E, after the dielectric material 28 is removed the sidewall spacer material 34 (e.g., SiN) may be etched to form the sidewall spacers. The sidewall spacer material 34 may be etched using an anisotropic etching process that exposes the underlying metal material 22 and the field plate 26. The etching process may also remove other materials, e.g., the passivation layer 18, to expose the underlying metal material 22. Further, in the opening 33 at the region of the non-self-aligned field plate, the sidewall spacer material 34 may be removed.

Figure 8F:
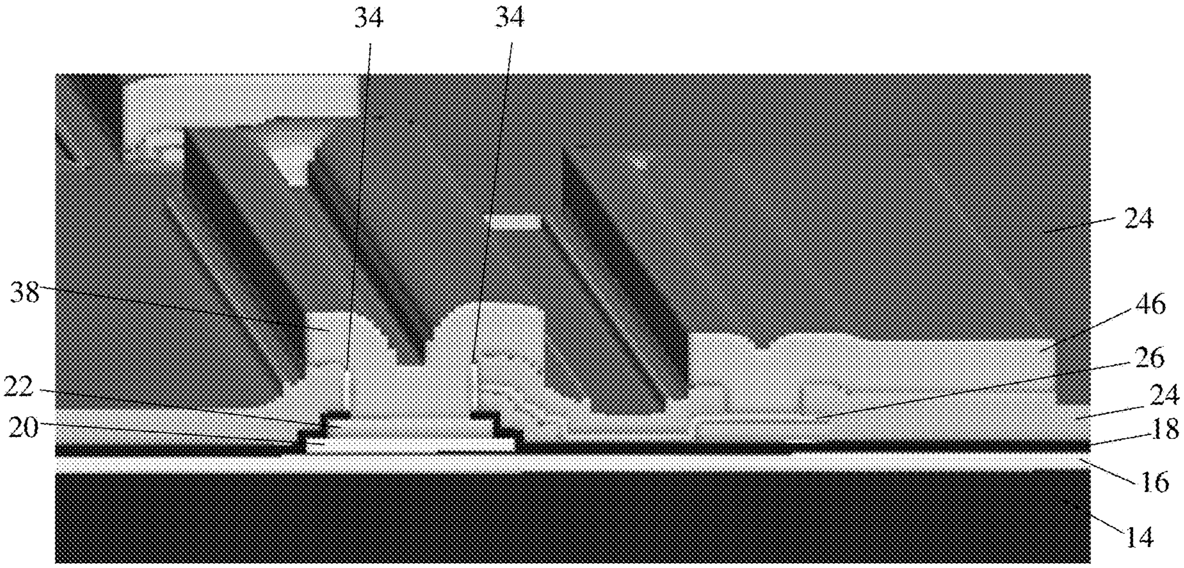

In FIG. 8F, the gate metal 38 may be formed to the underlying metal material 22 and the field plate 26 by a conventional deposition process, followed by a patterning process. In embodiments, the deposition process may be a CVD process and the patterning process may be a conventional lithography and etching process as described herein. In this way, the field plate 26 may be self-aligned (i.e., horizontally aligned) with the gate metal 38 over the gate structure 20. In particular, the field plate 26 may vertically overlap with a portion of the gate structure 20, including the GaN material.

Referring back to FIG. 1, the interlevel dielectric (ILD) 40 may be formed over the dielectric layer 24 and the gate metal 38 using conventional deposition processes, e.g., CVD. The back end of the line (BEOL) contacts 44 and BEOL metals 48 may be formed by one or more conventional lithography, etching, and deposition processes as already described herein.

The devices may be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either surface interconnections and buried interconnections or both surface interconnections and buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:

at least one gate structure over semiconductor material, the at least one gate structure comprising an active layer, a gate metal extending from the active layer and a sidewall spacer on sidewalls of the gate metal; and a field plate aligned with the at least one gate structure and isolated from the gate metal by the sidewall spacer, wherein the field plate is in contact with the sidewall spacer, and wherein the gate metal comprises a narrow stem portion and a wider overhanging portion being held over the field plate.

2. The structure of claim 1, wherein the field plate is horizontally aligned with the at least one gate.

3. The structure of claim 2, wherein the field plate comprises TiN, which extends vertically over the active layer and adjacent to the gate metal.

4. The structure of claim 2, wherein the field plate completely surrounds the gate metal of the same gate structure.

5. The structure of claim 2, wherein the field plate is on one side of the gate metal.

6. The structure of claim 2, wherein the field plate comprises a step shape which contacts a passivation layer extending partially over the active layer.

7. The structure of claim 1, wherein the sidewall spacer comprises SiN.

8. The structure of claim 1, wherein the active layer comprises p-doped GaN.

9. The structure of claim 1, wherein the field plate is offset from a second gate structure.

10. The structure of claim 1, wherein the at least one gate structure comprises adjacent gate structures with the field plate extending between the gate metal of the adjacent gate structures.

11. A structure comprising:

at least one gate structure; and a field plate which vertically overlaps with a portion of the at least one gate structure, wherein the field plate is electrically isolated from the gate structure by sidewall spacers, and wherein the field plate is in contact with the sidewall spacers, and wherein a gate metal of the at least one gate structure comprises a narrow stem portion and a wider overhanging portion being held over the field plate.

12. The structure of claim 11, wherein the field plate completely surrounds gate metal extending from one of the at least one gate structure.

13. The structure of claim 11, wherein the field plate extends to one side of gate metal extending from the at least one gate structure.

14. The structure of claim 11, wherein the at least one gate structure comprises adjacent gate islands which deplete a two dimensional electron gas concentration of a depletion mode gate.

15. The structure of claim 14 wherein the field plate is common to and extends between and overlaps with the adjacent gate islands.

16. The structure of claim 15, wherein the field plate is isolated from the adjacent gate islands by sidewalls spacers.

17. The structure of claim 11, wherein the field plate contacts a passivation layer that partially extends over an active layer of the at least one gate structure.

18. The structure of claim 11, wherein the field plate comprises a step shape.

19. A method comprising:

forming at least one gate structure over semiconductor material, the at least one gate structure comprising an active layer, a gate metal extending from the active layer and a sidewall spacer on sidewalls of the gate metal; and forming a field plate aligned with the at least one gate structure and isolated from the gate metal by the sidewall spacer, wherein the field plate is in contact with the sidewall spacer, and wherein the gate metal comprises a narrow stem portion and a wider overhanging portion being held over the field plate.

* * * * *